(12) United States Patent
Doi et al.

(10) Patent No.: US 7,573,194 B2
(45) Date of Patent: Aug. 11, 2009

(54) DISPLAY APPARATUS AND METHOD OF MANUFACTURING DISPLAY APPARATUS

(75) Inventors: Masato Doi, Tokyo (JP); Toyoharu Oohata, Tokyo (JP); Katsuhiro Tomoda, Tokyo (JP); Toshihiko Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 406 days.

(21) Appl. No.: 11/381,456

(22) Filed: May 3, 2006

(65) Prior Publication Data

US 2006/0250085 A1 Nov. 9, 2006

(30) Foreign Application Priority Data

May 9, 2005 (JP) ............................. 2005-135892

(51) Int. Cl.
*H01J 63/04* (2006.01)
(52) U.S. Cl. ............................. 313/506; 257/40; 349/43
(58) Field of Classification Search ......... 313/504–506; 349/43, 129; 445/61; 257/40, 59
See application file for complete search history.

(56) References Cited

U.S. PATENT DOCUMENTS

| 6,727,645 | B2 * | 4/2004 | Tsujimura et al. ........... 313/504 |
| 6,892,450 | B2 | 5/2005 | Ohba et al. |
| 2003/0070274 | A1 | 4/2003 | Ohba et al. |
| 2004/0125253 | A1 * | 7/2004 | Kim et al. ..................... 349/43 |

FOREIGN PATENT DOCUMENTS

JP 2003051621 2/2003

* cited by examiner

*Primary Examiner*—Nimeshkumar D. Patel
*Assistant Examiner*—Mary Ellen Bowman
(74) *Attorney, Agent, or Firm*—K & L Gates LLP

(57) ABSTRACT

A display apparatus is provided. In the display apparatus, a plurality of light emitting devices are mounted in an orderly arranged state, mending light emitting devices capable of light emission are disposed directly above the failed ones of the plurality of light emitting devices, whereby the portions of the failed ones of the plurality of light emitting devices can be mended (repaired), and it is possible to eliminate dark spot defects in use of the display apparatus.

14 Claims, 16 Drawing Sheets

FIG.14
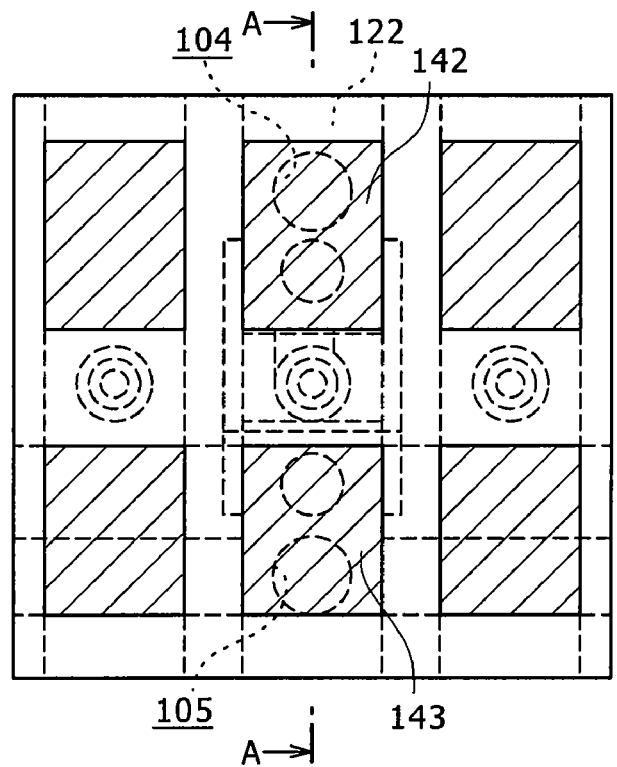
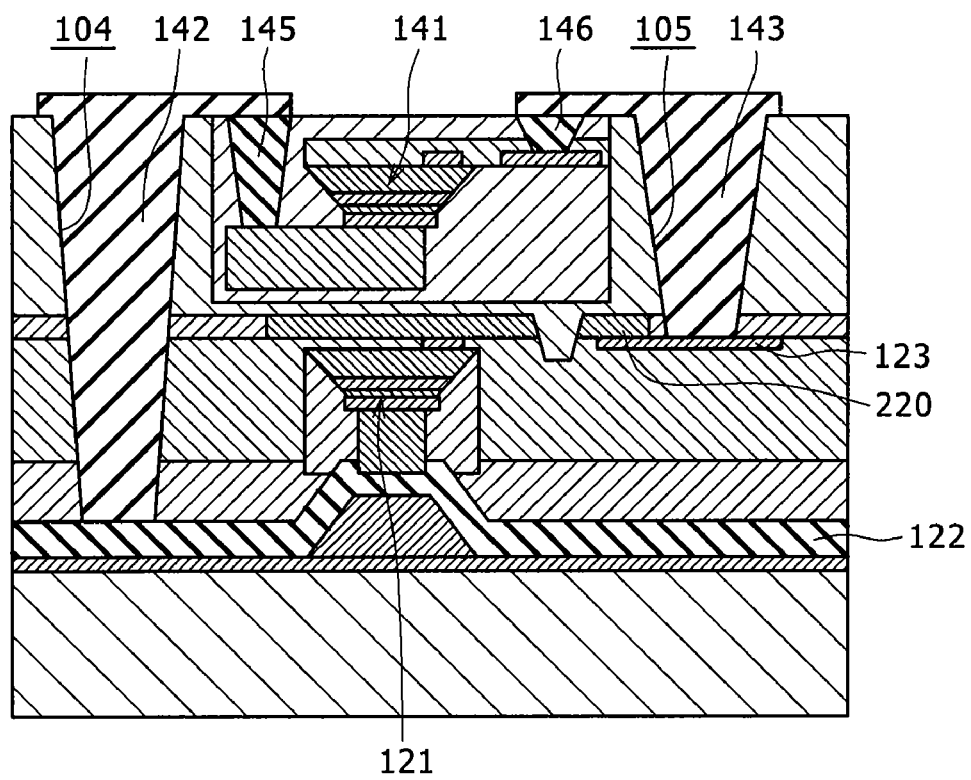

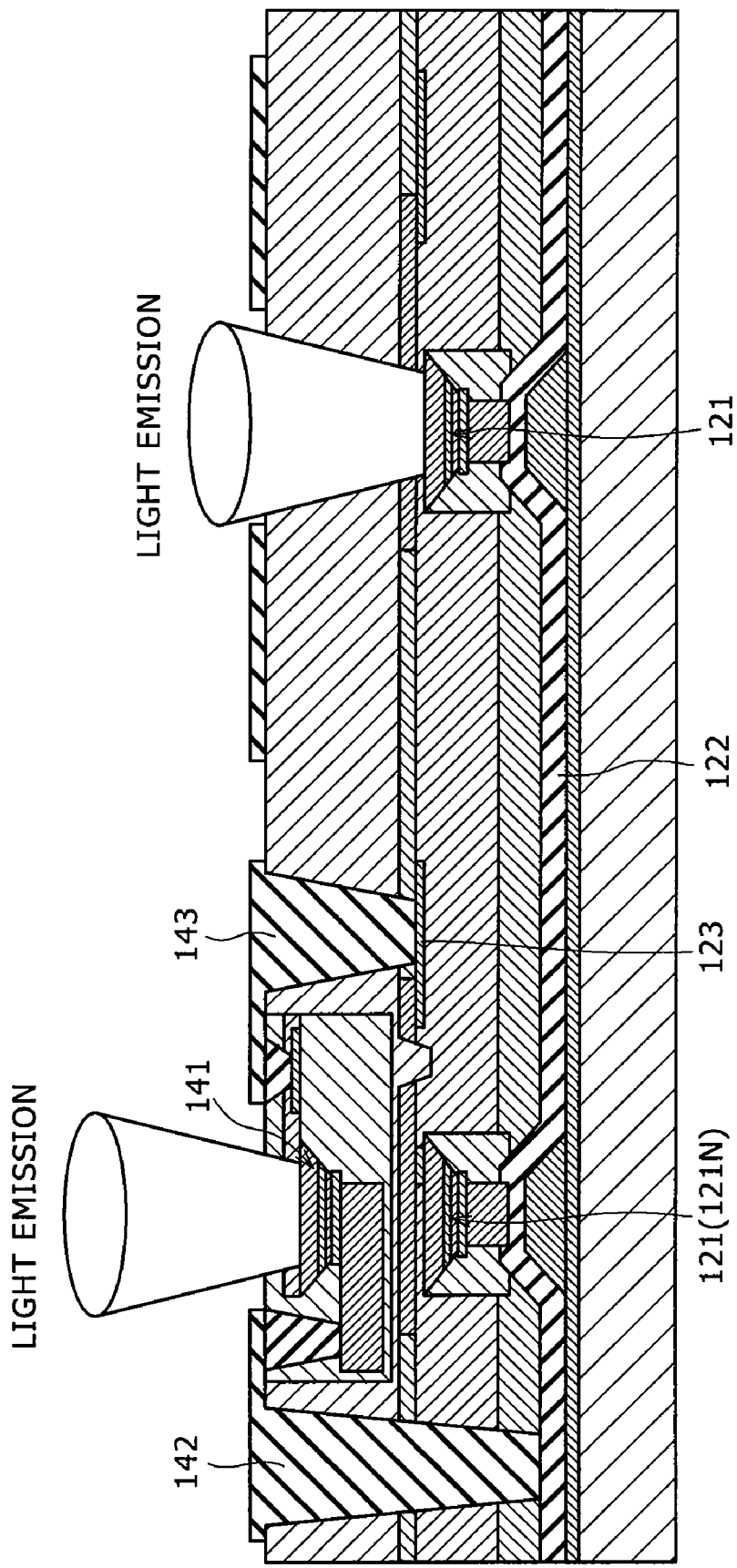

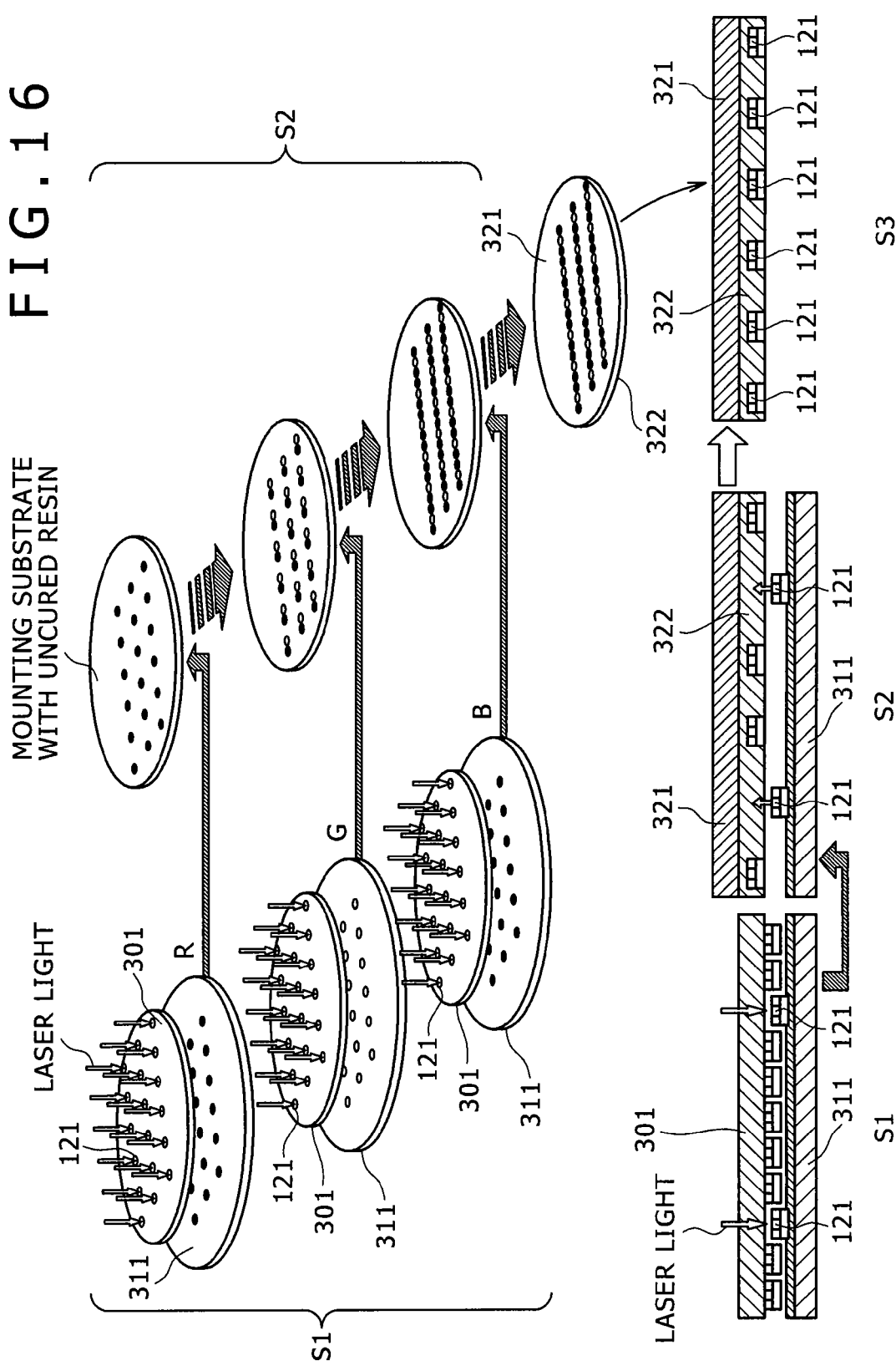

DISPLAY APPARATUS AND METHOD OF MANUFACTURING DISPLAY APPARATUS

CROSS REFERENCES TO RELATED APPLICATIONS

The present application claims priority to Japanese Patent Application JP 2005-135892 filed in the Japanese Patent Office on May 9, 2005, the entire contents of which being incorporated herein by reference.

BACKGROUND

The present application relates to a display apparatus, and a method of manufacturing a display apparatus, wherein it is easy to mend a failure in emitting light.

A display called LED display realized by mounting very small LEDs in a two-dimensional arrangement, with LEDs for RGB colors arranged at each pixel, has been disclosed (see, for example, Japanese Patent Laid-open No. 2003-51621).

Among the LEDs mounted in the two-dimensional arrangement, there is present a device incapable of emitting light before mounting of the device itself due to a crystal defect or a process failure, or a pixel where the device is not mounted due to a mounting failure or where an open- or short-circuit failure occurs due to a positional error in mounting. For alleviating the failure, there is a method of either breaking the wiring connected to the failed device by laser processing or re-wiring. According to this method, however, the failed device remains as it is, resulting in a dark spot defect in use of the display.

In order to remove the dark spot defect, it is ideal to remove the defective LED and to re-mount a normal LED in the same position. However, this process has not been practical because the step of mounting the normal LED in strictly the same manner as before is very difficult and time-consuming to carry out.

Thus, there is a need to solve the problem that there has been no simple process for re-mounting a normal LED (an LED capable of normal light emission) as a substitute for a defective LED in a display and that it has been impossible to eliminate a dark spot defect in the display.

SUMMARY

According to an embodiment, there is provided a display apparatus including a plurality of light emitting devices mounted in an orderly arranged state, wherein a mending light emitting device capable of emitting light is disposed directly above a failed one of the plurality of light emitting devices.

According to another embodiment, there is provided a method of manufacturing a display apparatus including a plurality of light emitting devices mounted in an orderly arranged state, the method including: embedding a mending light emitting device capable of emitting light in an insulation film covering the plurality of light emitting devices, at a position directly above a failed one of the plurality of light emitting devices; providing the insulation film with contact holes communicated respectively with the mending light emitting device and a wiring connected to the failed light emitting device; and forming mending wirings for connecting the mending light emitting device and the wiring connected to the failed light emitting device to each other through the contact holes.

In the display apparatus according to an embodiment, the mending light emitting device capable of emitting light is disposed directly above the failed one (the one incapable of emitting light) of the plurality of light emitting devices. Therefore, since the mending light emitting device capable of normal light emission is formed directly above the failed light emitting device, it is possible, on an apparent basis, to replace the failed light emitting device by the normal (not-failed) light emitting device in the same position, without removing the failed light emitting device. Accordingly, it is possible to eliminate the dark spot defect in use of the display device (e.g., a display or a backlight in a liquid crystal display apparatus).

In the method of manufacturing a display apparatus according to another embodiment, the mending light emitting device capable of light emission is embedded in the insulating film covering the plurality of light emitting devices, at a position directly above the failed one of the plurality of light emitting devices. Therefore, since the mending light emitting device capable of normal light emission is formed directly above the failed light emitting device, it is possible, on an apparent basis, to replace the failed light emitting device by the normal (not-failed) light emitting device in the same position, without removing the failed light emitting device. Accordingly, it is possible to eliminate the dark spot defect in use of the display apparatus (e.g., a display or a backlight in a liquid crystal display apparatus). In addition, the method includes providing the insulation film with contact holes communicated respectively with the mending light emitting device and the wiring connected to the failed light emitting device, and forming mending wirings for connecting the mending light emitting device and the wiring connected to the failed light emitting device to each other through the contact holes. Therefore, the wiring for the failed light emitting device can be utilized, instead of newly laying around a wiring connected to the mending light emitting device. Accordingly, the mending wiring for the mending light emitting device can be formed while minimizing the process load.

The above and other objects, features, and advantages will become apparent from the following description when taken in conjunction with the accompanying drawings.

BRIEF DESCRIPTION OF THE FIGURES

FIG. 14 shows a layout diagram showing one embodiment of the method of manufacturing a display apparatus, and a sectional diagram taken along line A-A of the layout diagram;

FIG. 15 is a schematic configurational sectional diagram for illustrating a light emission state of the display apparatus; and FIG. 16 illustrates a laser assembly.

DETAILED DESCRIPTION

The mending (repair) of the part of a failed one of a plurality of light emitting device is achieved by disposing a mending light emitting device capable of light emission directly above the failed one of the plurality of light emitting devices, whereby elimination of a dark spot defect in use of the display apparatus (e.g., a display or a backlight in a liquid crystal display apparatus).

An embodiment of the display apparatus will be described below referring to the schematic configurational sectional diagram shown in FIG. 1. In reference to FIG. 1, a display including a plurality of light emitting devices mounted in a two-dimensional arrangement will be described as an example.

Figure 1:
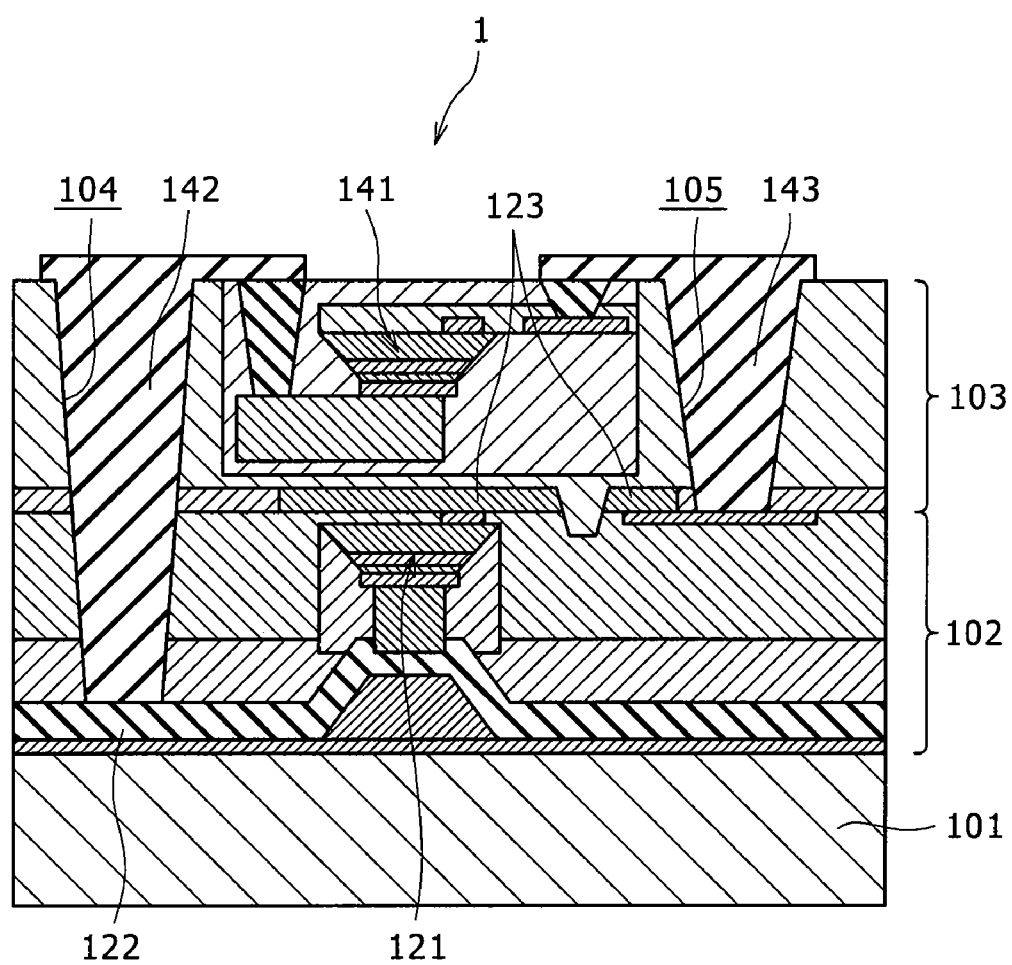
FIG. 1 is a schematic configurational sectional diagram showing an embodiment of the display apparatus.

As shown in FIG. 1, the display apparatus 1 includes a plurality of light emitting devices 121 mounted on a substrate 101 in a two-dimensional arrangement. These light emitting devices 121 are embedded in an insulation film 102 formed on the substrate 101. A first wiring 122 and a second wiring 123 are connected to each light emitting device 121. The second wiring 123 is composed of a laminate structure of a titanium (Ti) layer and a gold (Au) layer, for example. A portion of the second wiring 123 is formed on the light emitting device 121 and, therefore, the portion is formed of a transparent conductive material such as, for example, ITO (Ion Tin Oxide).

It is assumed that of the light emitting devices 121, one light emitting device (e.g., the light emitting device shown in the figure) 121N is failed, i.e., is incapable of light emission, due to a failure or loss of the light emitting device itself or due to a wiring failure. A mending light emitting device 141 capable of normal light emission is provided directly above such a light emitting device 121N. The mending light emitting device 141 is formed to be embedded in a transparent insulation film 103 so formed as to cover the light emitting device 121N on the upper side of the latter. A first mending wiring 142 is connected to the mending light emitting device 141, and the first mending wiring 142 is connected to the first wiring 122 for the light emitting device 121N through a contact hole 104 formed in the insulation films 103 and 102. Similarly, a second mending wiring 143 is connected to the mending light emitting device 141, and the second mending wiring 143 is connected to the second wiring 123 for the light emitting device 121N through a contact hole 105 formed in the insulation films 103 and 102.

In addition, in the configuration shown, the second wiring 143 is preferably connected to the mending light emitting device 141 through a transparent electrode 144 which is connected to the mending light emitting device 141. This is for preventing the light emitted from the mending light emitting device 141 from being shielded by the second wiring 143. With the second wiring 143 thus connected to the mending light emitting device 141 through the transparent electrode 144, the light emitted from the mending light emitting device 141 is transmitted through the transparent electrode 144 to the exterior. In other words, a light-shielding wiring (the mending wirings 142, 143) is not laid out on the upper side of the light emission region.

Besides, at least one of the first wiring 122 and the second wiring 123 connected to the failed light emitting device 121N is cut (broken). In the drawing, the second wiring 123 on the upper side is cut. Therefore, the second mending wiring 143 is connected to the portion, on the side opposite to the side of connection to the light emitting device 121N, of the second wiring 123 having been thus cut. The portion of the second wiring 123 on the side of connection with the second mending wiring 143 is connected to a wiring for driving the light emitting device.

In order that the mending light emitting device 141 can be conformed to the original light emitting device in light emission luminance and the like, the mending light emitting device is preferably provided with the same structure as that of the plurality of light emitting devices 121 mounted in the orderly arrangement. With the same structure thus adopted, there arises no difference in light emission performance between the light emitting device 121N and the mending light emitting device 141, and the quality of the display apparatus can be retained. In addition, since the light emitting device 121 and the mending light emitting device 141 are in a stack of upper and lower two stages, a slight positional difference is generated in the vertical direction. However, the height of the mending light emitting device 141 can be neglected when the height of the mending light emitting device 141 is set sufficiently small as compared with the horizontal period (interval) of the pixels, for example, set at about 0.01 mm as compared with the period (interval) of pixels of 0.15 mm. The mending light emitting device is not re-mounted in quite the same position as the failed light emitting device but, instead, the mending light emitting device 141 is mounted directly above the defective light emitting device, i.e., in the same position as viewed on a plan layout basis. With this structure, the quality of the display apparatus is not degraded, since the vertical positional difference is negligible.

Further, the peripheral structure of the mending light emitting device 141, for example, the structure of wirings, the transparent electrode and the like is also desirably the same as that of the light emitting device 121. Therefore, it is preferable that the mending light emitting device 141 is not formed as a singular light emitting device but, instead, main bodies of the light emitting devices are formed on the substrate in steps similar to those for a display panel, while forming the wirings connected to the mending light emitting devices in such a pattern as to be easily connectable to the wirings for the defective light emitting devices, the mending light emitting devices are individually separated from the substrate, and the mending light emitting devices are mounted in the same manner as the singular light emitting devices.

The display apparatus 1 as above is applicable not only to a display in which a plurality of light emitting devices are mounted in an orderly arranged state but also to a liquid crystal backlight in which a plurality of light emitting devices are mounted in an orderly arranged state.

Besides, in the case where the display apparatus 1 must be inspected for light emission characteristics as inspection items concerning the light emitting devices, in order to prevent the defective light emitting devices left unremoved from constituting a shade against light emission, it may be necessary that the display structure of the light emitting devices at the time of inspection and at the time of re-mounting is the top emission type. It should be noted here, however, that the final display structure can be converted to the bottom emission type by removing (transferring) the light emitting devices onto another substrate after the re-mounting.

The display apparatus 1 in an embodiment has a configuration in which the mending light emitting devices 141 capable of light emission are disposed directly above the failed ones 121N of the plurality of light emitting devices 121, so that the defective light emitting devices 121N can, on an apparent basis, be replaced by the normal light emitting devices (the mending light emitting devices 141) in the same positions, without removing the failed light emitting devices 121N. Therefore, it is possible to eliminate dark spot defects in use of the display apparatus (e.g., a display or a backlight in a liquid crystal display apparatus) 1.

An embodiment of the method of manufacturing a display apparatus will be described referring to the manufacturing step sectional diagrams shown in FIGS. 2 to 14. In FIGS. 2 to 14, a method of manufacturing a display in which a plurality of light emitting devices are arranged two-dimensionally will be described. Besides, in each of the drawings, an upper figure shows a plan layout diagram, and a lower figure shows a sectional diagram.

Figure 2:
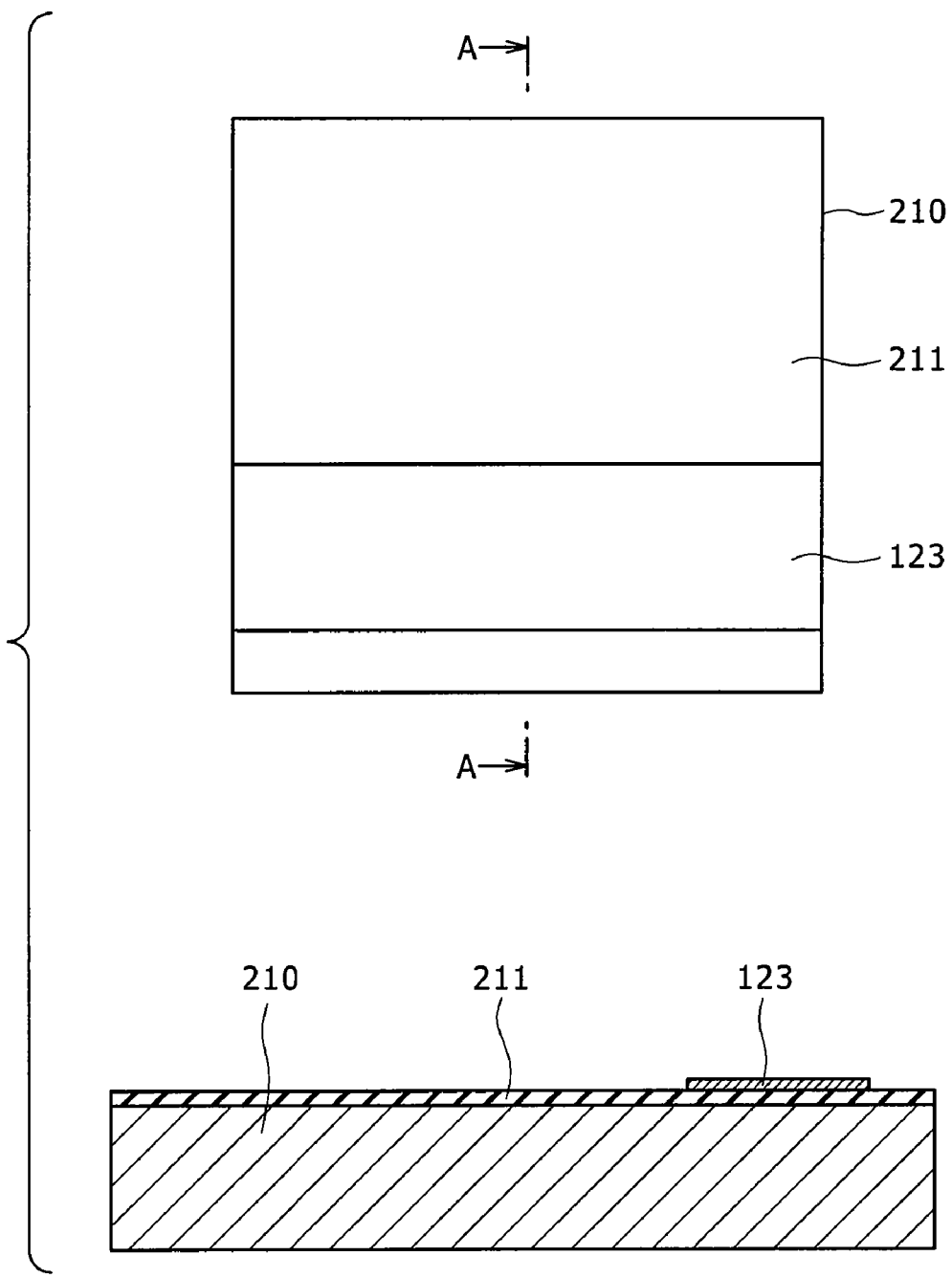
FIG. 2 shows a layout diagram showing one embodiment of the method of manufacturing a display apparatus, and a sectional diagram taken along line A-A of the layout diagram.

The method of mounting the light emitting devices will be described. First, as shown in FIG. 2, a release layer 211 is formed on an embedding substrate 210 and, further, a second wiring 123 is formed on a portion of the release layer 211. The second wiring 123 is composed of a laminate structure of a titanium (Ti) layer and a gold (Au) layer, for example.

Figure 3:
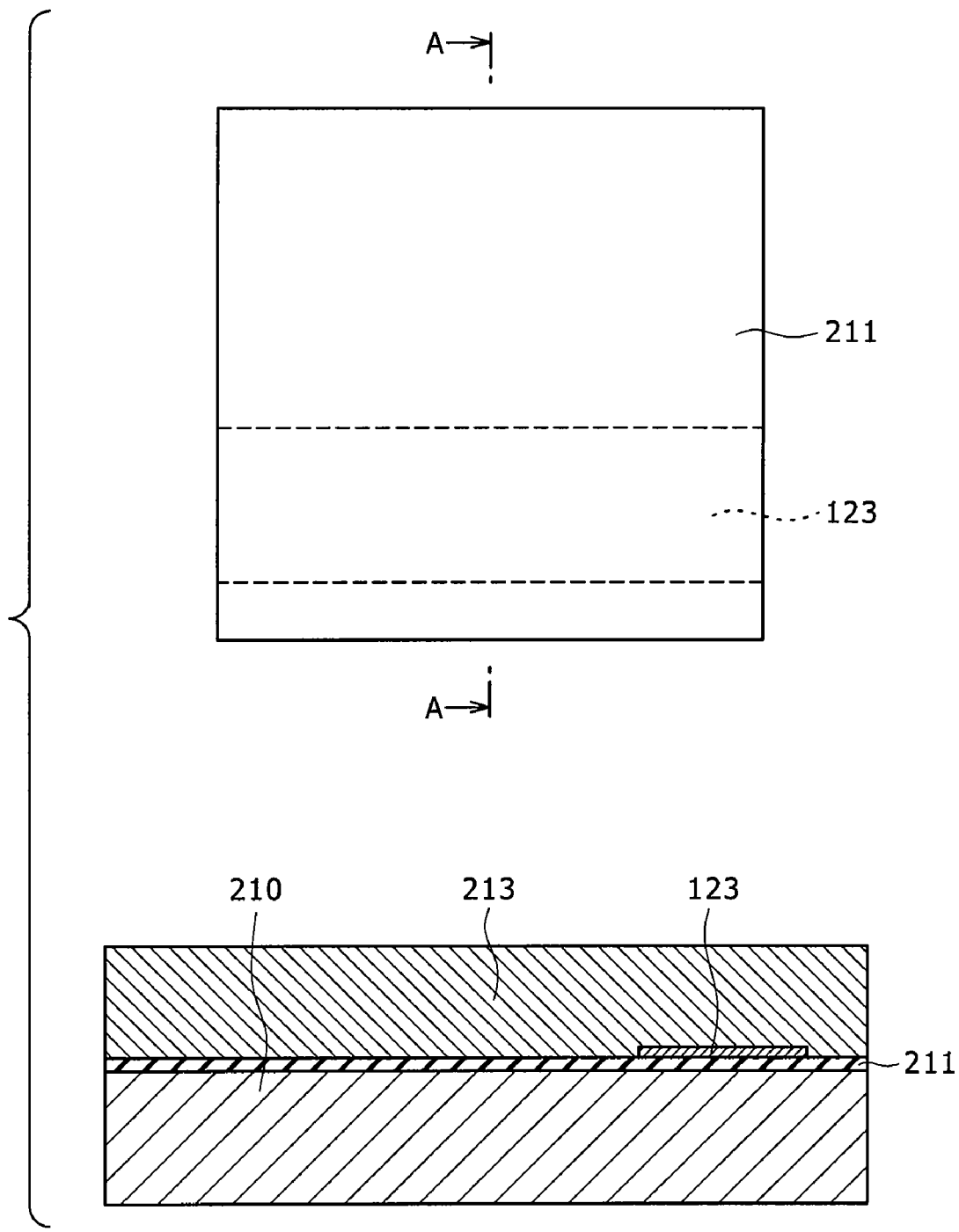
FIG. 3 shows a layout diagram showing one embodiment of the method of manufacturing a display apparatus, and a sectional diagram taken along line A-A of the layout diagram.

Next, as shown in FIG. 3, a resin layer 213 is formed on the release layer 211. The resin layer 213 is for embedding the light emitting devices in a later step, and is formed of a UV-curable resin, for example. In addition, the second wiring 123 is covered with the resin layer 213.

Figure 4:
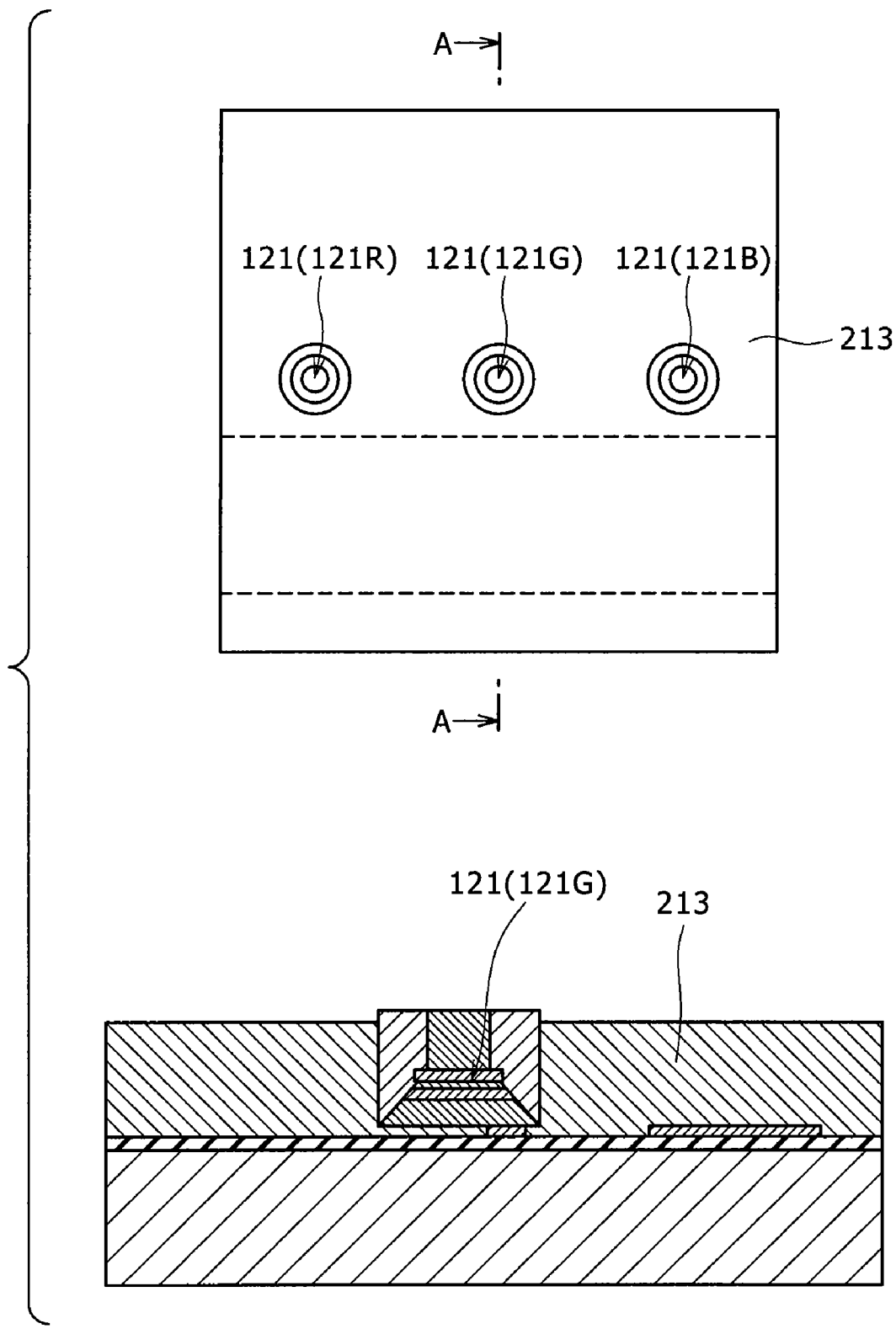
FIG. 4 shows a layout diagram showing one embodiment of the method of manufacturing a display apparatus, and a sectional diagram taken along line A-A of the layout diagram.

Subsequently, as shown in FIG. 4, the light emitting devices 121 are embedded in the resin layer 213. The light emitting devices 121 are constituted, for example, of light emitting devices 121 (121R) for emitting red light, light emitting devices 121 (121G) for emitting green light, light emitting devices 121 (121B) for emitting blue light, as three primary colors of light. Naturally, the light emission colors of the light emitting devices 121 are appropriately selected according to the use. Thereafter, the surface is flattened, and then the resin layer 213 is cured by irradiation with UV rays.

Figure 5:
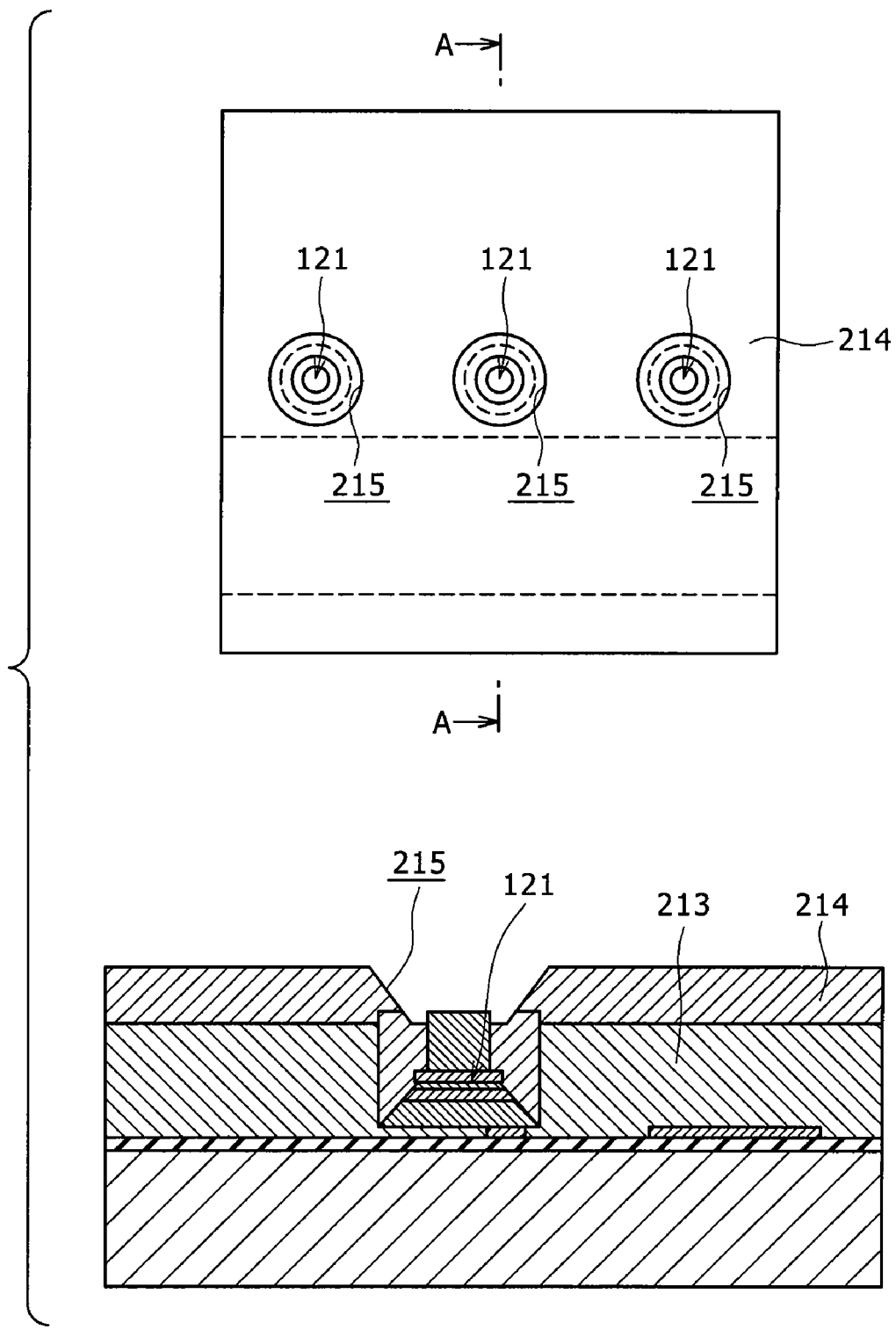
FIG. 5 shows a layout diagram showing one embodiment of the method of manufacturing a display apparatus, and a sectional diagram taken along line A-A of the layout diagram.

Next, as shown in FIG. 5, an insulation film (e.g., a photosensitive insulation film is used) 214 is formed on the resin layer 213, and then the insulation film 214 is formed with openings 215 at portions on the upper side of the light emitting devices 121 by an ordinary photolithography technology. Then, the insulation film 214 is thermally cured, and thereafter the insulation film 214 is subjected to ashing or etching for a short time, whereby the openings 214 reaching the light emitting devices 121 are shaped into a mortar-like (roughly conical) shape, for example.

Figure 6:
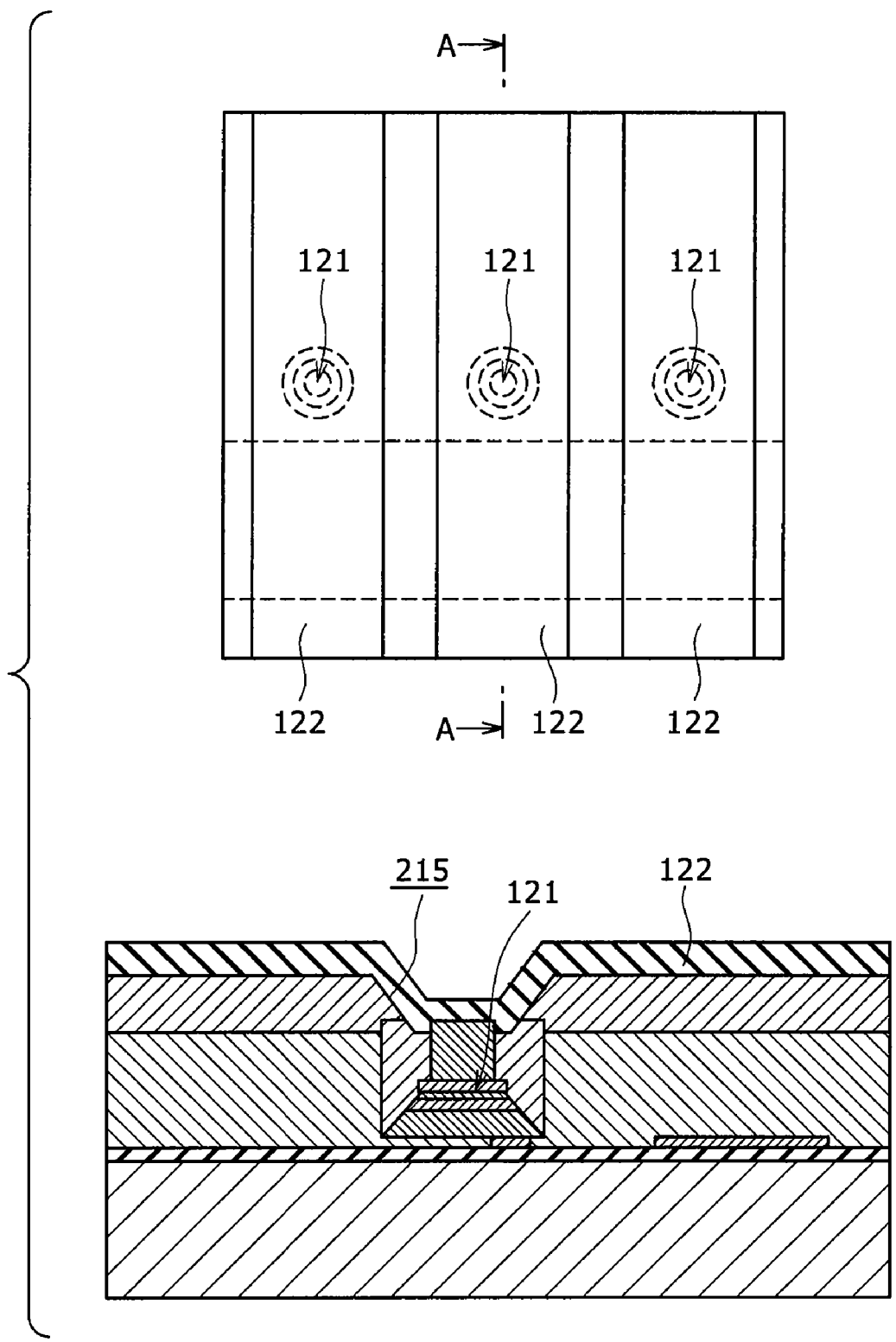
FIG. 6 shows a layout diagram showing one embodiment of the method of manufacturing a display apparatus, and a sectional diagram taken along line A-A of the layout diagram.

Subsequently, as shown in FIG. 6, a first wiring 122 connected to the light emitting devices 121 via the openings 215 is formed. The first wiring 122 is formed, for example, by a sputtering method in which an adhesion layer composed of a titanium (Ti) layer is formed and then a copper (Cu) seed layer is formed. Followingly, copper is built up by copper plating while using the copper (Cu) seed, to form a copper film. Thereafter, a mask is formed by an ordinary photolithography technology, and etching is conducted by use of the mask, to form a copper wiring as a first wiring 122. Usually, the etching is wet etching.

Figure 7:
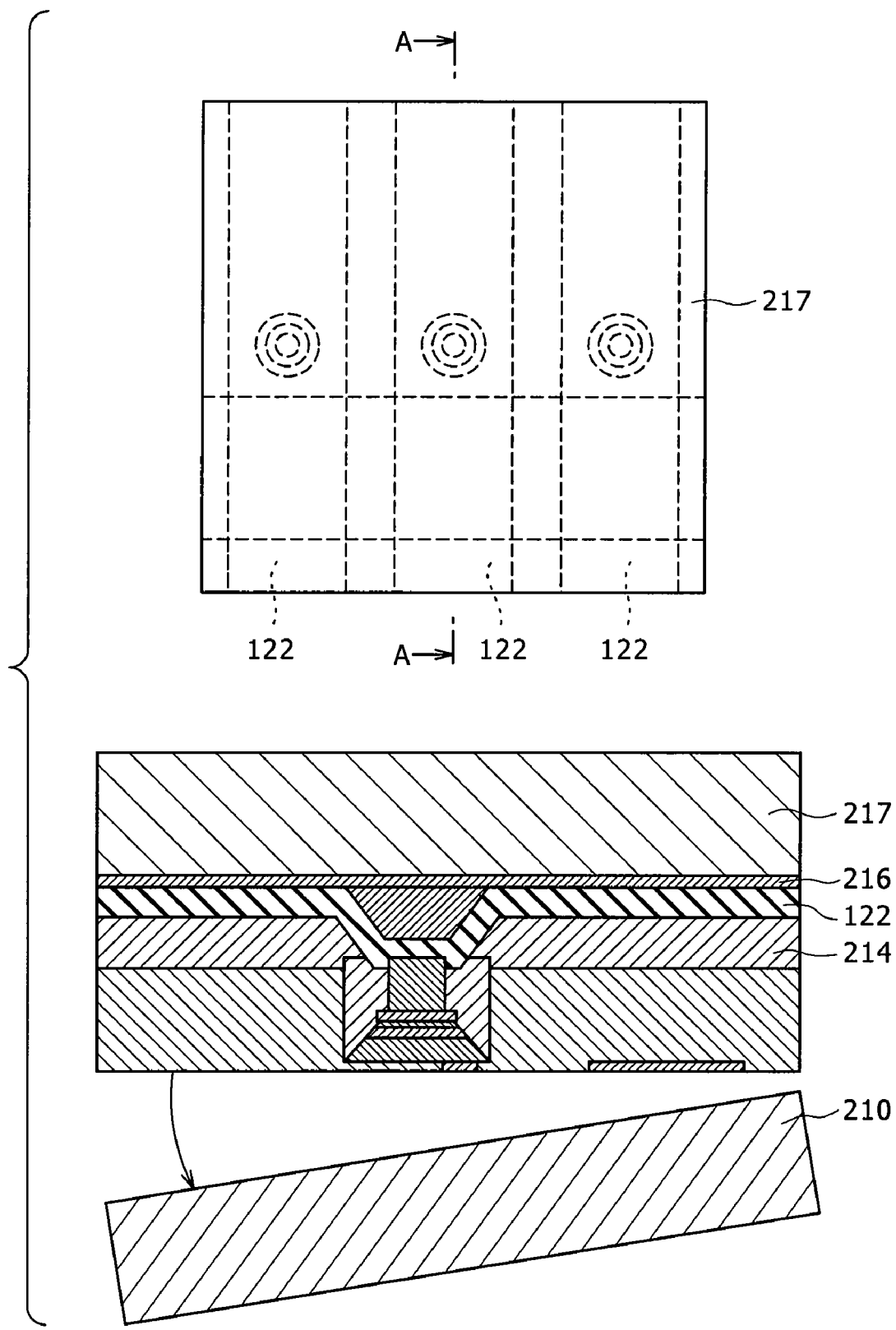
FIG. 7 shows a layout diagram showing one embodiment of the method of manufacturing a display apparatus, and a sectional diagram taken along line A-A of the layout diagram.

Next, as shown in FIG. 7, an insulation film 216 covering the first wiring 122 is formed on the insulation film 214. Further, the surface of the insulation film 216 is flattened, and then a display substrate 217 is adhered. Thereafter, the release layer 211 is removed, whereby the embedding substrate 210 is released.

Figure 8:
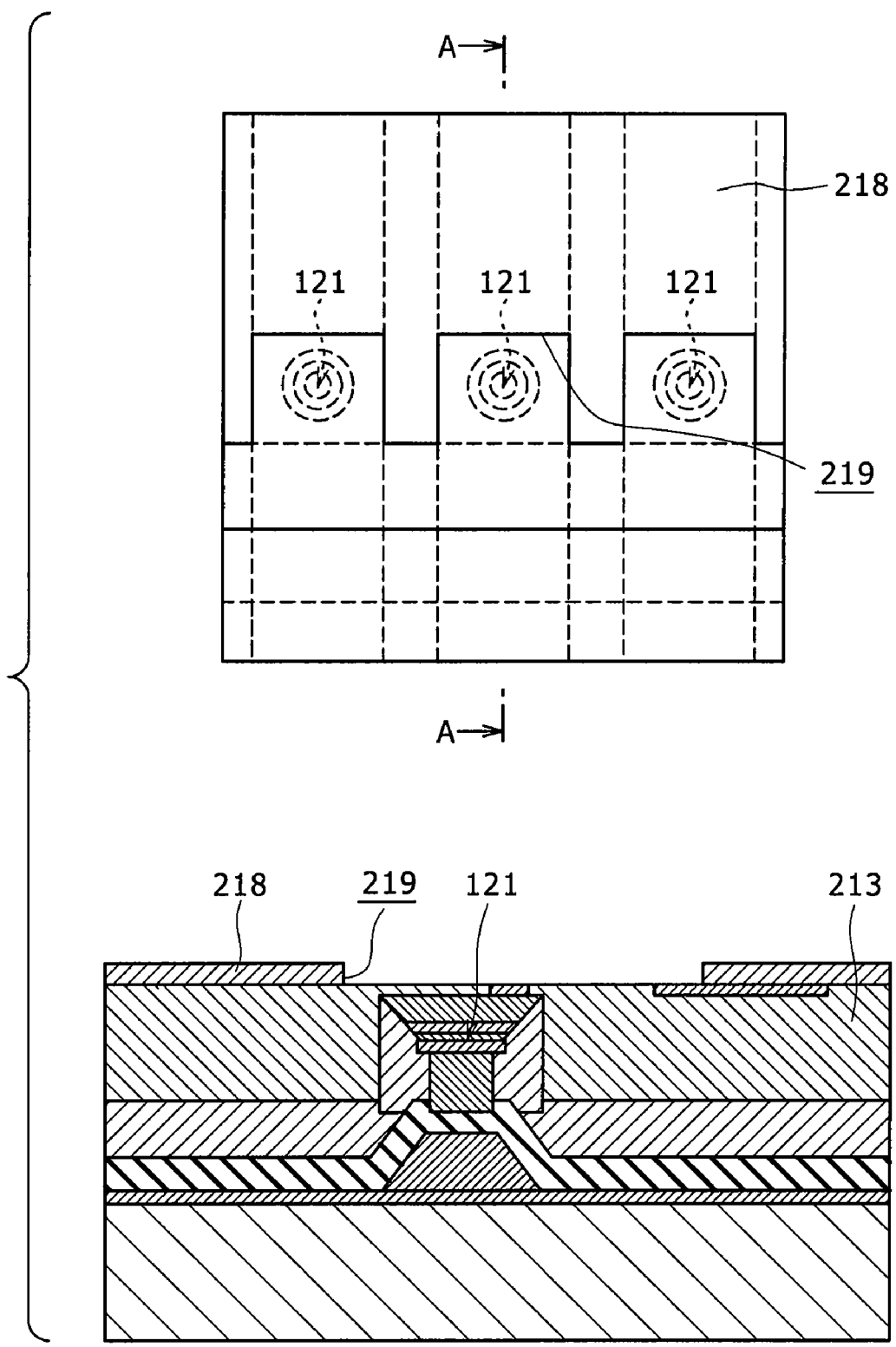
FIG. 8 shows a layout diagram showing one embodiment of the method of manufacturing a display apparatus, and a sectional diagram taken along line A-A of the layout diagram.

Subsequently, as shown in FIG. 8, an insulation film for forming ribs is formed on the insulation film 213, and by way of a photolithography step, a developing step, a thermal curing step, and an ashing or etching step, ribs 218 formed of the insulation film are formed. The ribs 218 are for determining the positions of transparent electrodes connected to the light emitting devices 121, and are formed with openings 219 at the positions where the transparent electrodes are to be formed.

Figure 9:
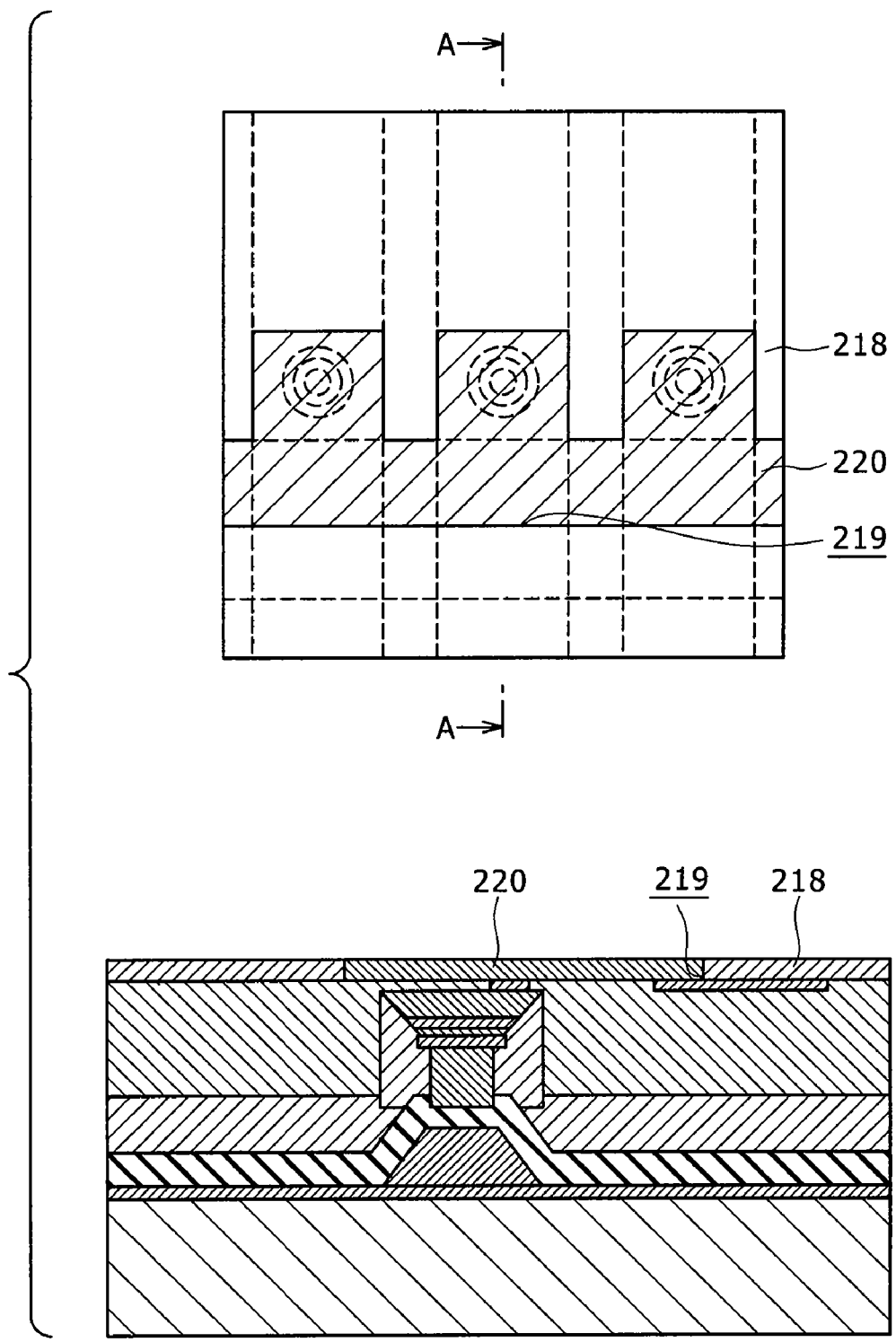
FIG. 9 shows a layout diagram showing one embodiment of the method of manufacturing a display apparatus, and a sectional diagram taken along line A-A of the layout diagram.

Next, as shown in FIG. 9, a transparent electrode material is applied so as to fill up the openings 219 formed in the ribs 218. Examples of the material used as the transparent electrode material include ITO (Indium Tin Oxide), ZnO, and AZO. Thereafter, the transparent electrode material is cured, and then the surface thereof is polished by Chemical Mechanical Polishing (CMP), to be flattened so that transparent electrodes 220 composed of an ITO ink is left only in the openings 219. The transparent electrode 220 functions as a part of the second wiring 123. In this manner, a plurality of light emitting devices 121 are formed on the display substrate 217.

Figure 10:
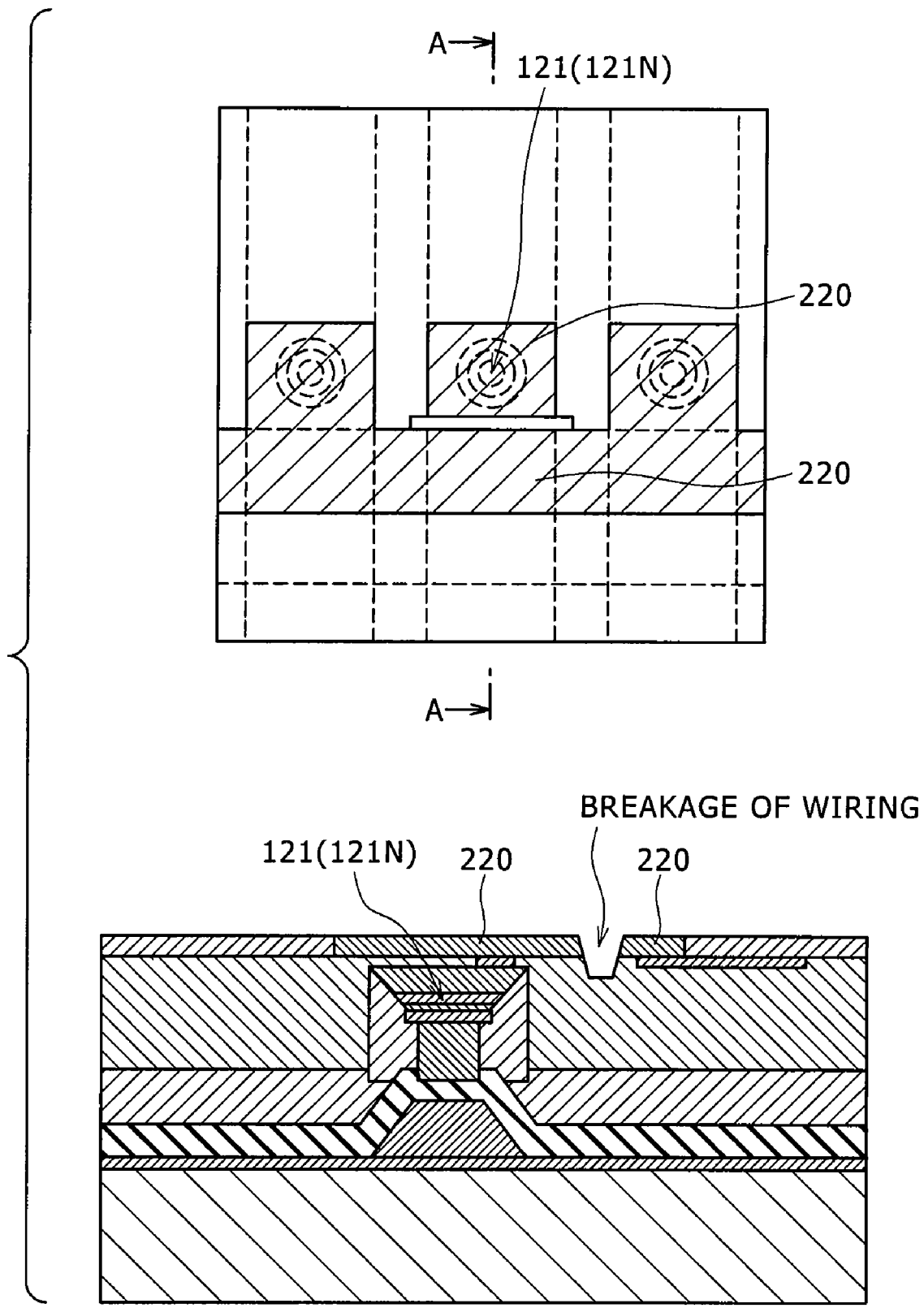
FIG. 10 shows a layout diagram showing one embodiment of the method of manufacturing a display apparatus, and a sectional diagram taken along line A-A of the layout diagram.

Next, the plurality of light emitting devices 121 formed on the display substrate 217 are inspected for light emission. When it has been found as a result of the inspection that a certain light emitting device 121 (121N) is incapable of light emission due, for example, to a failure or loss of the light emitting device itself or to a wiring failure, the transparent electrode 220 connected to the failed one 121 (121N) of the plurality of light emitting devices 121 is broken (disconnected), as shown in FIG. 10. The resulting condition is equivalent, on an electrical basis, to the condition where the failed light emitting device 121N has been removed.

Figure 11:
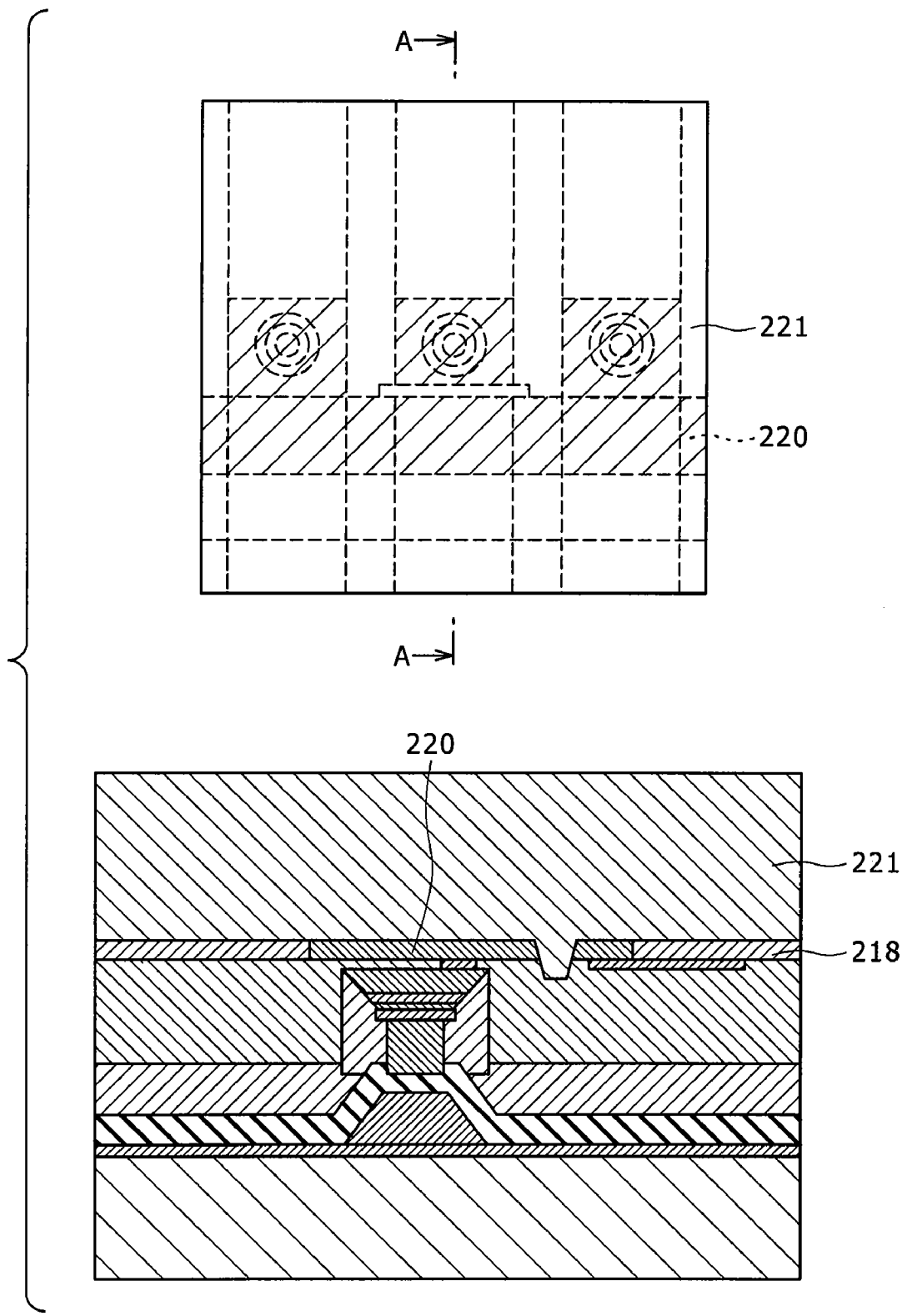
FIG. 11 shows a layout diagram showing one embodiment of the method of manufacturing a display apparatus, and a sectional diagram taken along line A-A of the layout diagram.

Subsequently, as shown in FIG. 11, a resin layer 221 is formed on the ribs 218. The resin layer 221 is a layer in which mending light emitting devices are to be embedded in a later step, and is formed of a UV-curable resin, for example. In addition, the transparent electrodes 220 are covered by the resin layer 221.

Figure 12:
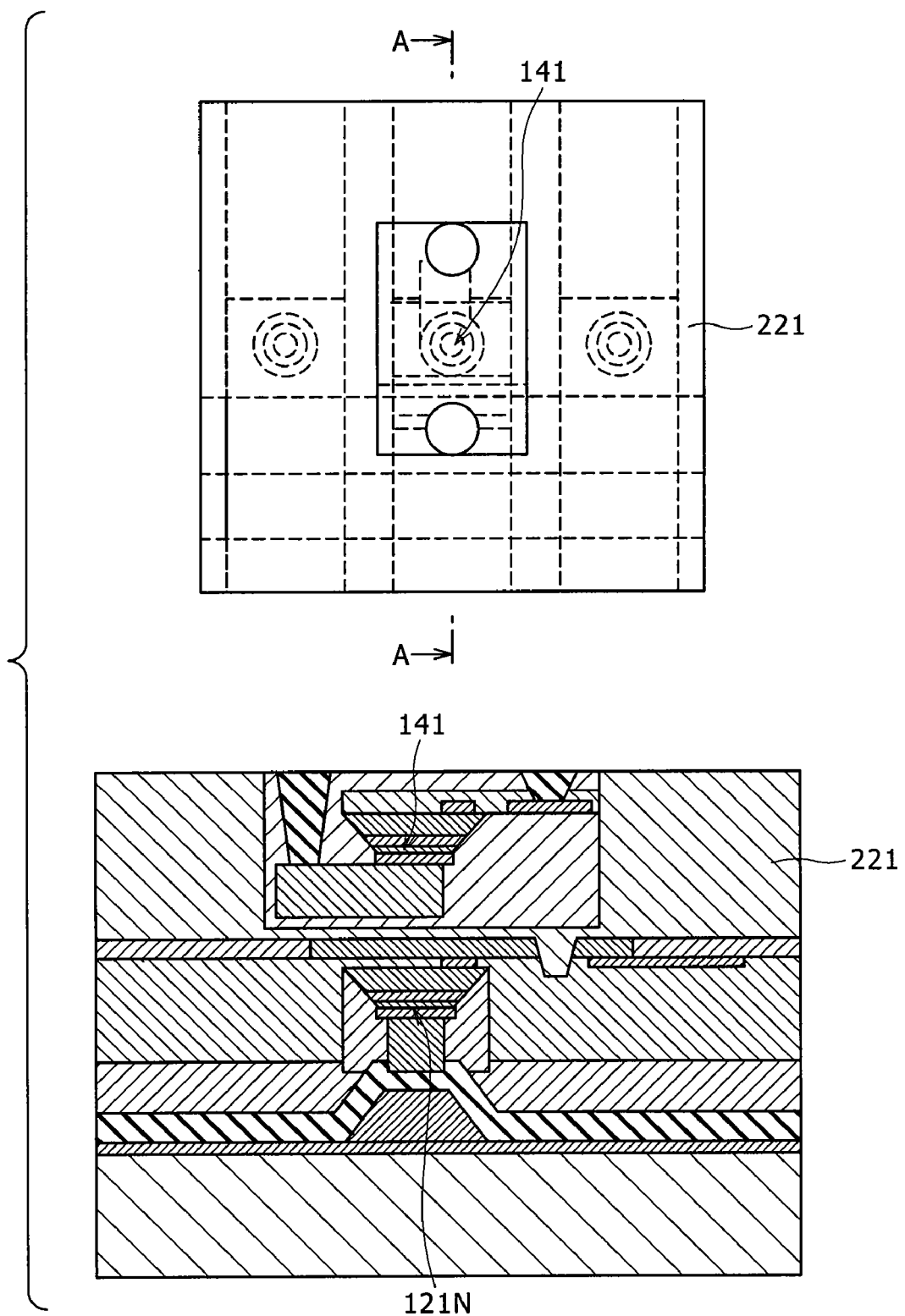
FIG. 12 shows a layout diagram showing one embodiment of the method of manufacturing a display apparatus, and a sectional diagram taken along line A-A of the layout diagram.

Next, as shown in FIG. 12, the mending light emitting devices 141 are embedded in the resin layer 221. The mending light emitting device 141 has the same structure as that of the defective light emitting device 121N, and capable of emitting light with the same oscillation wavelength as that of the original light emitting device. Thereafter, the surface is flattened, and the resin layer 221 is cured by irradiation with UV rays.

Figure 13:
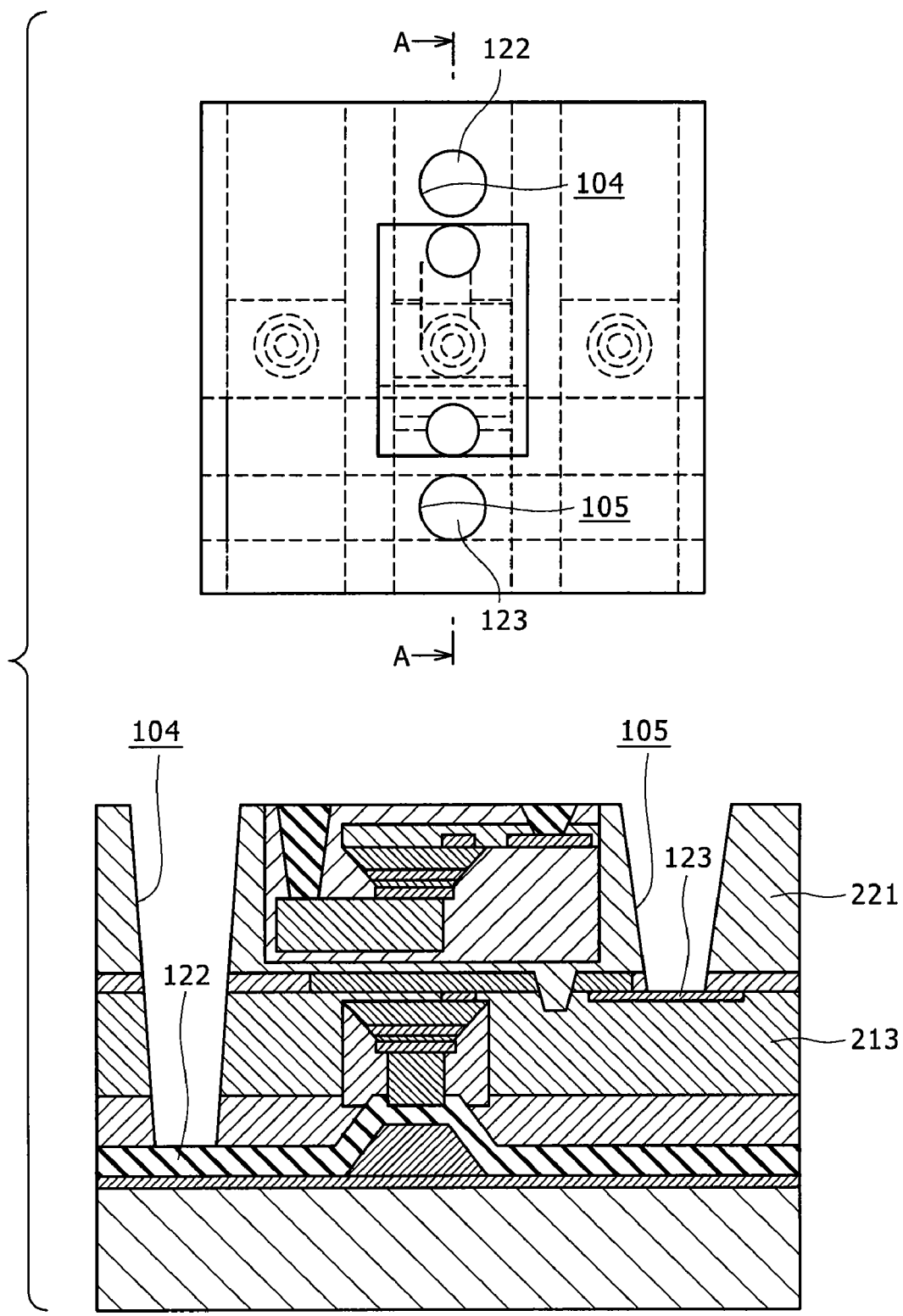
FIG. 13 shows a layout diagram showing one embodiment of the method of manufacturing a display apparatus in, and a sectional diagram taken along line A-A of the layout diagram.

Subsequently, as shown in FIG. 13, contact holes 104 reaching to the first wiring 122 through the resin layer 221 are formed, and contact holes 105 reaching the second wiring 123 are formed. The contact holes 104, 105 can be formed by laser processing, for example. Thereafter, resin ashing or etching is conducted for a short time, for reshaping the inside shapes of the contact holes 104 and 105 formed in the resin layers 221, 213 and the like.

Next, as shown in FIG. 14, a first mending wiring 142 extending from an electrode 145 of the mending light emitting device 141 and through the contact hole 104 to reach the first wiring 122 connected to the light emitting device 121 is formed, and a second mending wiring 143 extending from an electrode 146 of the mending light emitting device 141 and through the contact hole 105 to reach the second wiring 123 on the side different from the side of connection to the light emitting device 121 is formed. The first mending wiring 142 and the second mending wiring 143 are formed, for example, by a method in which an adhesion layer composed of a titanium (Ti) layer is formed, and then a copper (Cu) seed layer is formed. Followingly, copper is built up by copper plating while using the copper (Cu) seed, to form a copper film so as to fill up the contact holes 104 and 105. Thereafter, a mask is formed by an ordinary photolithography technology, and etching is conducted by use of the mask, to form the first mending wiring 142 and the second mending wiring 143 composed of copper wirings. Usually, the etching is wet etching.

The condition where the display apparatus 1 with the mending light emitting devices 121 mounted therein is put into light emission will be described, referring to the schematic configurational sectional diagram shown in FIG. 15. As shown in FIG. 15, the light emitting device 121 and the mending light emitting device 141 are caused to emit light by passing an electric current in the first wiring 122 and the second wiring 123; in this case, the current passes through the first mending wiring 142 and the second mending wiring 143, causing the mending light emitting device 141 to emit light. In this instance, since the positional relationship between the mending light emitting device 141 and the light emitting device 121 is such that the light emitting device 121 and the mending light emitting device 141 are in the stack of the upper and lower two stages, a slight positional difference is generated in the vertical direction. However, when the height of the mending light emitting device 141 is set sufficiently small as compared with the horizontal period (interval) of pixels, for example, when the height is set at about 0.01 mm as contrasted to a pixel period (interval) of 0.15 mm, the height of the mending light emitting device 141 can be neglected. Thus, the mending light emitting device 141 is not re-mounted in the same position as that of the failed light emitting device 121N but, instead, the mending light emitting device 141 is mounted directly above the defective light emitting device 121N; namely, the mending light emitting device 141 is mounted in the same position as the defective light emitting device 121N as viewed on a plan layout basis. Even with this configuration, the quality of the display apparatus 1 is not degraded, since the positional difference in the vertical direction is negligible.

In the method of manufacturing a display apparatus, the mending light emitting devices 141 capable of light emission are embedded in the insulation film 221 covering the plurality of light emitting devices 121, at positions directly above the failed ones 121N of the plurality of light emitting devices 121. Therefore, the mending light emitting devices 141 capable of normal light emission are formed directly above the failed light emitting devices 121N, instead of removing the failed light emitting devices 121N. Therefore, it is possible, on an apparent basis, to replace the failed light emitting devices 121N by the normal (non-failed) light emitting devices 141 in the same positions. Accordingly, it is possible to eliminate dark spot defects in use of the display apparatus (e.g., a display or a backlight in a liquid crystal display apparatus). Thus, the defects in a light emitting device array can be mended (repaired) comparatively easily.

In addition, the method includes forming the insulation films 221 and 213 and the like with the contact holes 104 and 105 communicated to the first wiring 122 and the second wiring 123 connected to the mending light emitting device 141 and the failed light emitting device 121N, and the step of forming the first mending wiring 142 and the second mending wiring 143 for connecting the mending light emitting device 141 and the first wiring 122 and the second wiring 123 connected to the failed light emitting device 121N to each other. Therefore, the first wiring 122 and the second wiring 123 for the failed light emitting device 121N can be utilized, instead of newly laying around the wirings for the mending light emitting device 141, so that it is possible to form the first mending wiring 142 and the second mending wiring 143 for the mending light emitting device 141, while minimizing the process load.

Next, the step of embedding the light emitting devices 121 in the resin layer 213 described above referring to FIG. 4 will be described referring to the manufacturing step diagrams shown in FIG. 16.

As shown in FIG. 16 step S1, a plurality of light emitting devices 121 formed on an LED (Light Emitting Device) substrate 301, the desired ones 121 are separated from the LED substrate 301 by irradiating the formation areas of the desired light emitting devices with laser light, and are adhered to a weakly pressure-sensitive adhesive relay substrate 311. Here, as an example, the light emitting devices 121 are adhered to the weakly pressure-sensitive adhesive relay substrate 311 on the basis of each light emission color.

Next, as shown in FIG. 16 step S2, the light emitting devices 121 adhered to the weakly pressure-sensitive adhesive relay substrate 311 are embedded in an uncured resin layer 322 on a mounting substrate 321. In this instance, since the uncured resin layer 322 is higher than the weakly pressure-sensitive adhesive relay substrate 311 in tackiness to the light emitting devices 121, the light emitting devices 121 are released from the weakly pressure-sensitive adhesive relay substrate 311 and adhered to the uncured resin layer 322 in the manner of being embedded into the uncured resin layer 322. The step of adhering the light emitting devices 121 to the weakly pressure-sensitive adhesive relay substrate 311 and the step of embedding the light emitting devices 121 adhered to the weakly pressure-sensitive adhesive relay substrate 311 into the uncured resin layer 322 formed on the mounting substrate 321 are carried out for each of the light emission colors.

Finally, as shown in FIG. 16 step S3, the uncured resin layer 322 is cured, whereby the light emitting devices 121 are fixed to the mounting substrate 321 through the resin layer 322.

In addition, as for the step of embedding the mending light emitting devices 141 into the resin layer 221 described above referring to FIG. 12, it suffices to carry out the step described above referring to the manufacturing step diagrams shown in FIG. 16. Specifically, it suffices that the light emitting devices corresponding to the positions of the light emitting devices to be mended are selected from the light emitting devices formed on the LED substrate, are then adhered to the weakly pressure-sensitive adhesive relay substrate 311, and are embedded into the resin layer on the upper side of the mending light emitting devices. In this case, the mending light emitting devices can also be adhered to the resin layer, collectively for the light emitting devices for each of the colors, instead of only for a single color. In addition, the light emitting devices for a plurality of pixels may also be treated like this, and the number of the light emitting devices formed on the LED substrate among the required number of light emitting devices to be mended can be optimized. Besides, for the mounting of the mending light emitting devices, an ordinary chip bonding apparatus can also be used.

The display apparatus and the method of manufacturing a display apparatus as above-described is applicable not only to a display using LEDs but also to an arrayed group of LED devices, such as a liquid crystal backlight and a light communication system, and to a surface emitting laser array.

In addition, in the method of manufacturing a display apparatus as above, the mending light emitting devices can be produced in the same steps as those for a display panel, so that it is unnecessary to specially construct a production line for the mending light emitting devices, whereby equipment cost and production cost can be reduced. Also, the light emission characteristics of a display panel and the light emission characteristics of the mending light emitting devices can be made to be substantially the same. Furthermore, the number and arrangement of the mending light emitting devices and the like can be arbitrarily modified on a design basis, depending on the situation of mending.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display apparatus comprising:
   a plurality of light emitting devices mounted in an orderly arranged state, at least one of said plurality of light emitted devices being a failed light emitting device and including a first light emitting layer; and
   a mending light emitting device including a second light emitting layer and capable of emitting light disposed directly above one of the failed light emitting devices;
   wherein the second light emitting layer is disposed above the first light emitting layer.

2. The display apparatus as set forth in claim 1, wherein a mending wiring communicated with a wiring connected to said failed light emitting device is connected to said mending light emitting device.

3. The display apparatus as set forth in claim 1, wherein said mending light emitting device has the same structure as that of said plurality of light emitting devices mounted in the orderly arranged state.

4. The display apparatus as set forth in claim 1, wherein said display apparatus is a display.

5. The display apparatus as set forth in claim 1, wherein said display apparatus is a liquid crystal backlight.

6. The display apparatus as set forth in claim 1, wherein said display apparatus is of a top emission type.

7. The display apparatus as set forth in claim 1, wherein said light emitting device is a light emitting diode.

8. A method of manufacturing a display apparatus including a plurality of light emitting devices mounted in an orderly arranged state, said method comprising:
   embedding a mending light emitting device including a first light emitting layer and capable of emitting light in an insulation film covering said plurality of light emitting devices, at a position directly above a failed one of said plurality of light emitting devices, the failed one of said plurality of light emitting devices including a second light emitting layer disposed below the first light emitting layer;
   providing said insulation film with contact holes communicated respectively with said mending light emitting device and a wiring connected to said failed light emitting device; and
   forming mending wirings for connecting said mending light emitting device and said wiring connected to said failed light emitting device to each other through said contact holes.

9. The method of manufacturing the display apparatus as set forth in claim 8, comprising:
   breaking at least a part of said wiring connected to said failed light emitting device, before carrying out said step of embedding said mending light emitting device.

10. The method of manufacturing the display apparatus as set forth in claim 8, wherein a light emitting device having the same structure as that of said plurality of light emitting devices mounted in the orderly arranged state is used as said mending light emitting device.

11. The method of manufacturing the display apparatus as set forth in claim 8, wherein said display apparatus is a display.

12. The method of manufacturing the display apparatus as set forth in claim 8, wherein said display apparatus is a liquid crystal backlight.

13. The method of manufacturing the display apparatus as set forth in claim 8, wherein said display apparatus is of a top emission type.

14. The method of manufacturing the display apparatus as set forth in claim 8, wherein a light emitting diode is used as said light emitting device.

* * * * *